Sept. 2, 1969 P. L. CHAGNON 3,464,105

METHOD OF PRODUCING SEMICONDUCTOR DEVICES

Filed April 21, 1966 6 Sheets-Sheet 1

INVENTOR.
PAUL L. CHAGNON

BY David M. Keay
AGENT.

METHOD OF PRODUCING SEMICONDUCTOR DEVICES

Filed April 21, 1966 6 Sheets-Sheet 2

INVENTOR.
PAUL L. CHAGNON

BY David M. Keay

AGENT.

Sept. 2, 1969 P. L. CHAGNON 3,464,105

METHOD OF PRODUCING SEMICONDUCTOR DEVICES

Filed April 21, 1966 6 Sheets-Sheet 3

INVENTOR.
PAUL L. CHAGNON

BY David M. Keay
AGENT.

INVENTOR.
PAUL L. CHAGNON

BY David M. Keay
AGENT.

METHOD OF PRODUCING SEMICONDUCTOR DEVICES

Filed April 21, 1966 6 Sheets-Sheet 5

INVENTOR.
PAUL L. CHAGNON

BY David M. Keay
AGENT.

INVENTOR.
PAUL L. CHAGNON
BY David M. Keay
AGENT.

United States Patent Office 3,464,105

Patented Sept. 2, 1969

3,464,105
METHOD OF PRODUCING SEMICONDUCTOR DEVICES

Paul L. Chagnon, Hamilton, Mass., assignor to Sylvania Electric Products Inc., a corporation of Delaware
Filed Apr. 21, 1966, Ser. No. 544,186
Int. Cl. B01j *17/00;* H01l *1/10*
U.S. Cl. 29—588 9 Claims

ABSTRACT OF THE DISCLOSURE

Method of fabricating transistors by mounting groups of three leads in a carrier strip with one end of each lead welded to a portion of the strip and the other end projecting through a hole in the strip. A semiconductor element is mounted on the projecting ends of each group of leads with appropriate connections between the semiconductor element and the leads. Each semiconductor element and the adjacent portions of the leads of each group are encapsulated in plastic. The portion of the strip with the welded ends of the leads is severed from the strip permitting the completed transistors to be removed from the strip.

Figure 1:
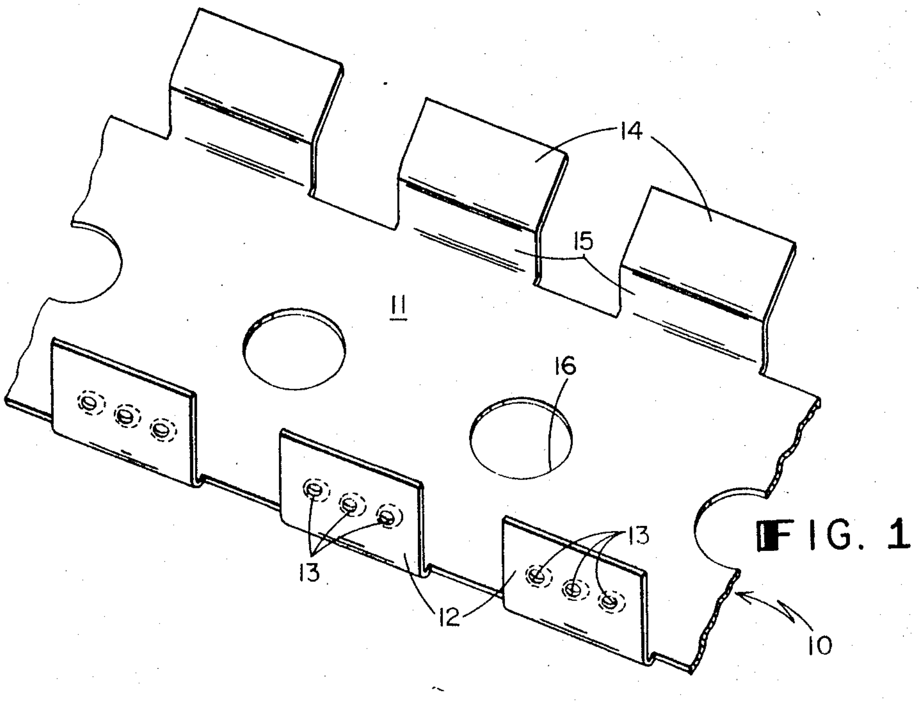

This invention relates to electrical translating devices. More particularly, it is concerned with improved methods for fabricating semiconductor devices.

Semiconductor devices, for example transistors, commonly available as individual electrical components have electrically active elements which consist of a die or chip of semiconductor material having active regions of opposite conductivity types forming too or more rectifying punctions and ohmic contacts to the active regions. A complete finished device also includes electrical leads for connecting the device into an electrical circuit. The electrically active elements and the leads are assembled in an enclosure which supports the leads so that they are insulated from each other and extend to the exterior of the enclosure in a desired pattern. The electrically active elements are appropriately supported within the enclosure and are electrically connected to the leads. The surrounding enclosure protects the active elements and the electrical connections between the active elements and the leads.

Presently well-known techniques of fabricating semiconductor devices by diffusing conductivity type imparting materials through openings in protective coatings on bodies of semiconductor material permit the simultaneous fabrication of a large number of electrically active elements of devices in a single wafer of semiconductor material. Because the active regions of each device can be made very small and because the active elements are batch produced in quantity in a single wafer, unit costs of material, processing, and handling are low.

After formation of the electrically active regions in a wafer of semiconductor material, the wafer is divided into individual dice each containing the electrically active regions of a semiconductor device. Then each individual die is mounted in a suitable enclosure. The enclosure commonly includes a pre-formed header or stem portion comprising prearranged leads supported in an insulating member. The die is mounted on the stem either directly or through an intermediate support and appropriate electrical connections are made between the active regions of the die and the leads. The die, the electrical connections between the die and the leads, the adjacent portions of the leads, and portions of the insulating supporting member are enclosed for protection as by sealing a cover portion of the enclosure to the stem or by encapsulating the parts in a suitable plastic.

Although preparation of the semiconductor dice is a large quantity, batch fabrication process resulting in low unit cost, mounting and connecting the dice to leads and enclosing the dice are individual one unit at a time operations. The stems on which the dice are mounted are subassemblies of pre-formed parts which are individually handled and manipulated prior to and during assembly with the dice. Thus, the cost of mounting and connecting a semiconductor die to electrical leads and enclosing the die may represent a substantial portion of the cost of a completed device.

It is an object of the present invention, therefore, to provide an improved method for producing semiconductor devices.

It is a more specific object of the invention to provide an improved method for assembling the electrically active elements of semiconductor devices to leads and providing enclosures for the devices, which method employs parts and materials in simplified form, reduces problems of preparation and handling, and is amendable to automatic or semiautomatic operation.

Briefly, in accordance with the method of the invention a plurality of conductive leads arranged in groups are attached to a carrier strip. A separate semiconductor element comprising the electrically active elements of a semiconductor device, or the active elements and additional structure for supporting and connecting the active elements, is mounted in fixed position on the leads of each group of leads with the leads electrically connected to active regions of the semiconductor element. Each semiconductor element and adjacent portions of the leads of the associated group of leads are encapsulated in a separate mass of nonconductive encapsulating material. Then, each of the plurality of encapsulated semiconductor elements and sections of the associated leads projecting from each mass of encapsulating material are separated from the carrier strip.

Figure 2:
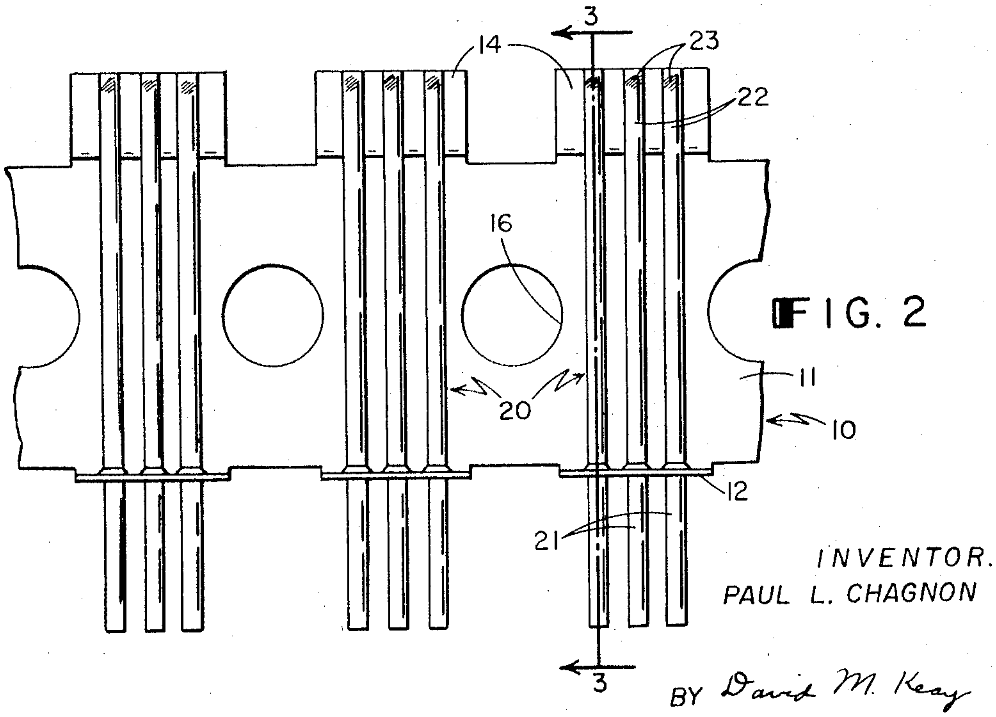
Figure 3:
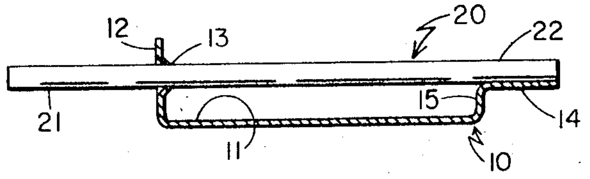
Figures 4, 5, 6:
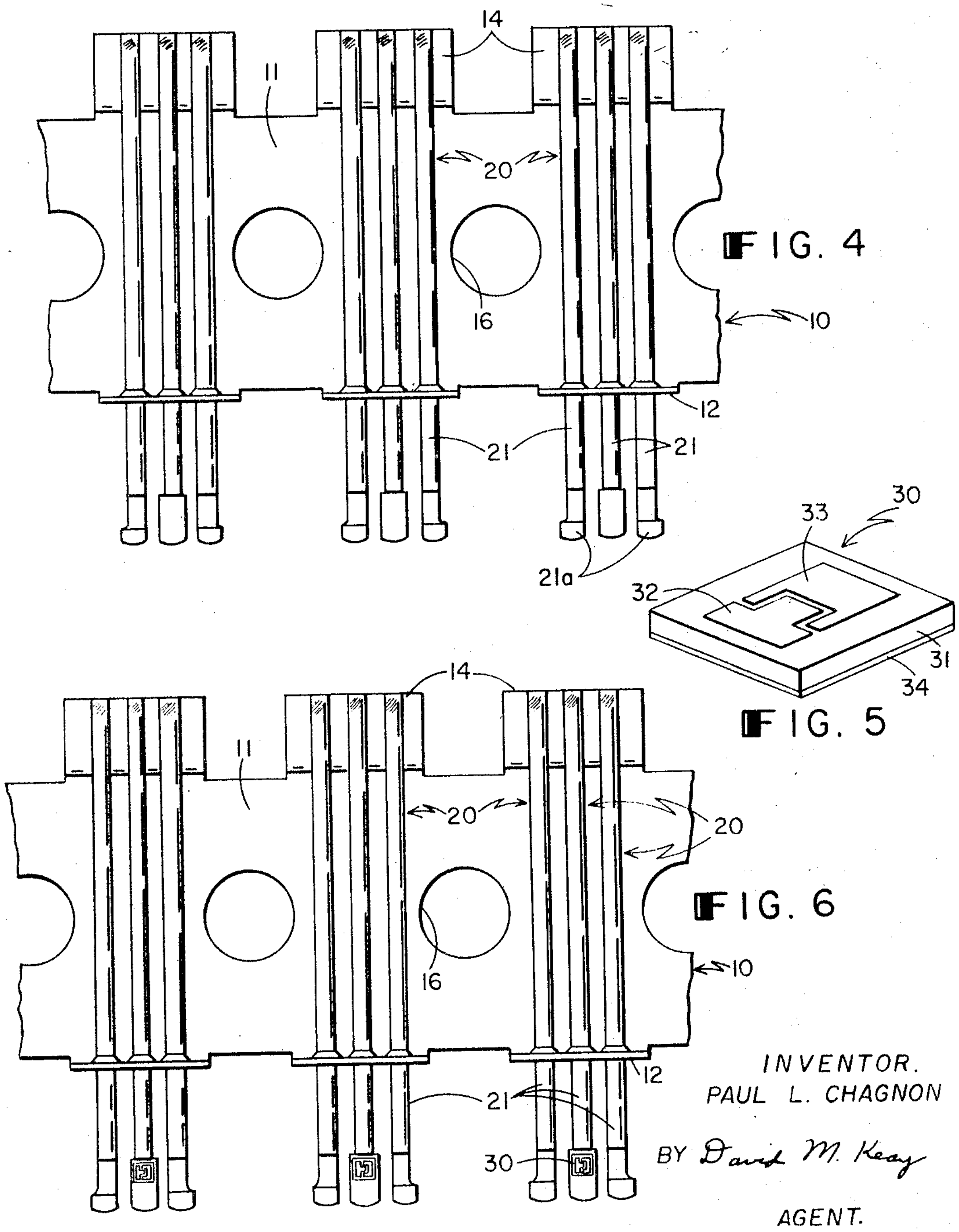
Figure 7:
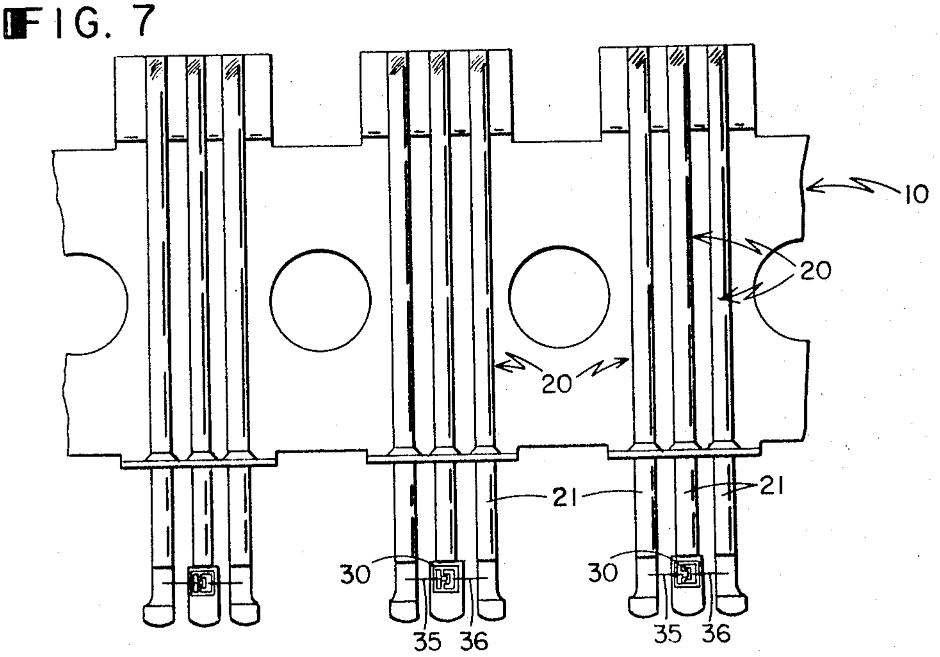
Figure 8:
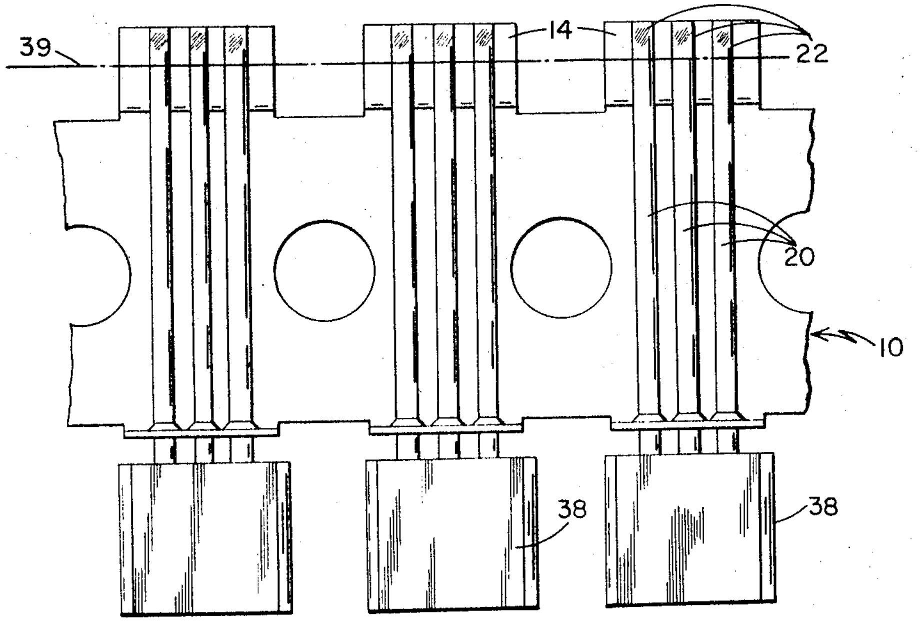
Figure 9:
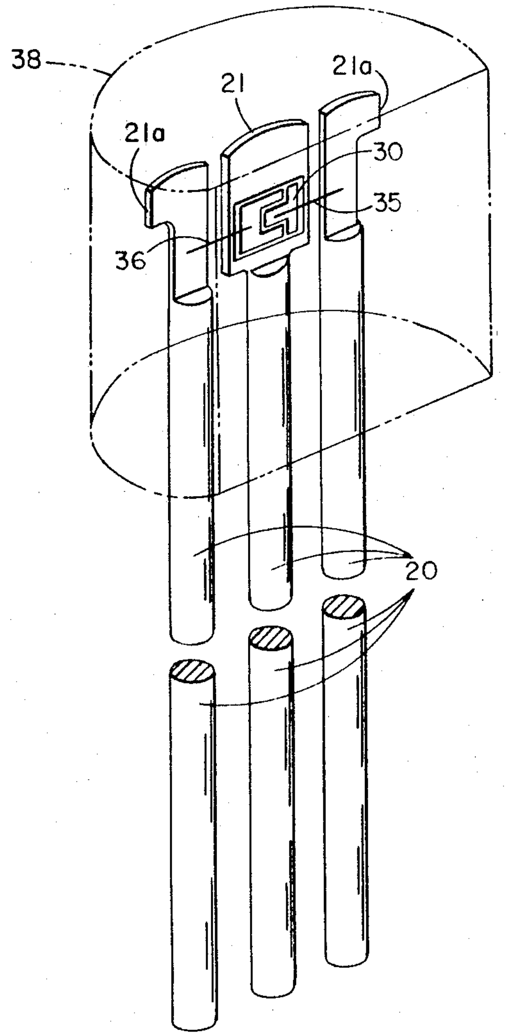
Figure 10:
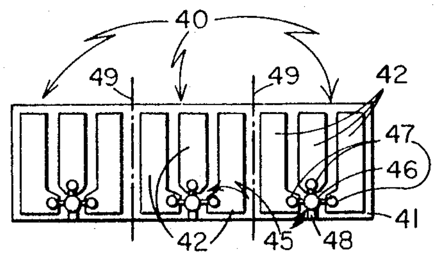
Figure 11:
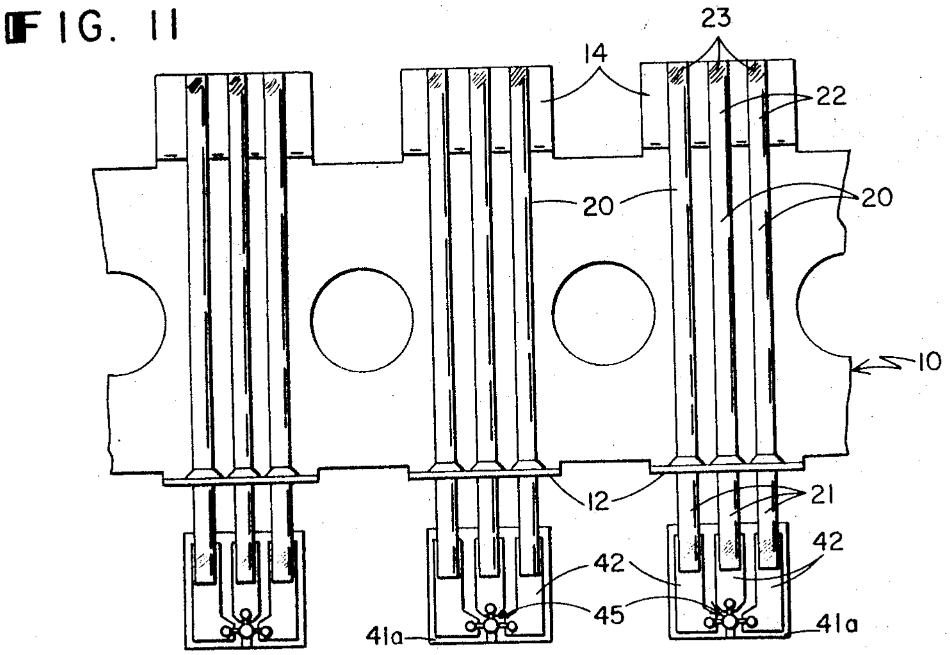
Figure 12:
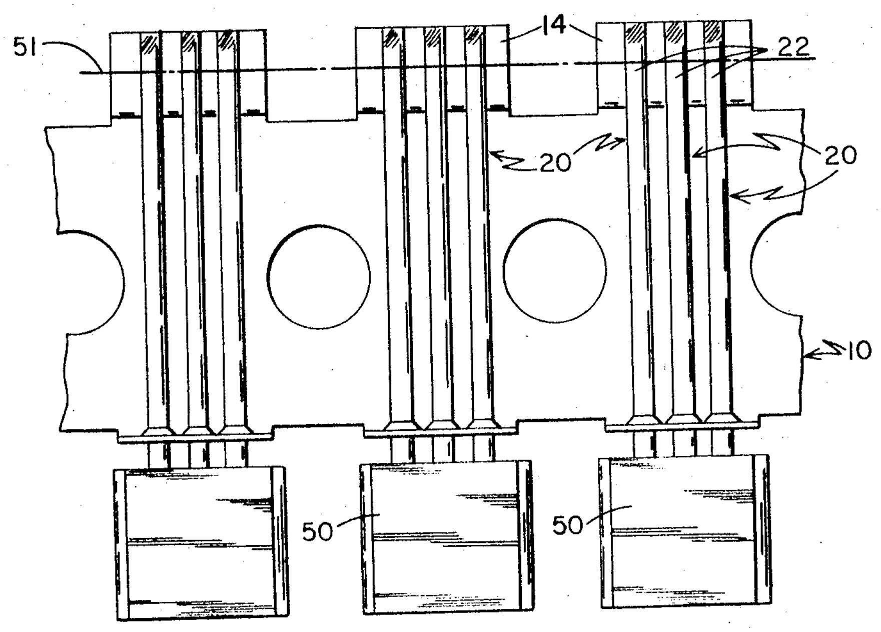
Figure 13:
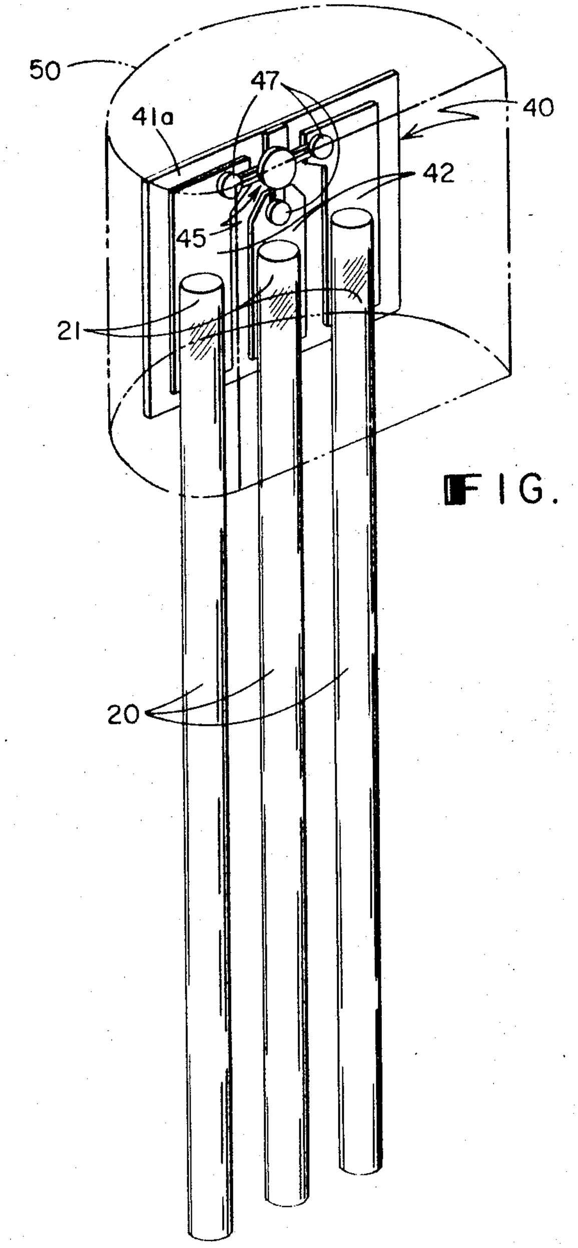

Additional objects, features, and advantages of the method of fabricating semiconductor devices according to the invention will be apparent from the following detailed discussion and the accompanying drawings wherein:

FIG. 1 is a perspective view of a fragment of an elongated carrier strip for holding leads arranged in a plurality of groups in position for the mounting of semiconductor elements, FIG. 2 is a plan view of the carrier strip of FIG. 1 with conductive leads attached in fixed position in the carrier strip, FIG. 3 is an elevational view of the carrier strip and leads of FIG. 2 taken in section along line 3—3 of FIG. 2, FIG. 4 is a plan view of the leads and carrier strip showing the ends of the leads formed to receive the active elements of a transistor, FIG. 5 is a perspective view of the electrically active elements of a double-diffused transistor to be mounted on a group of leads, FIG. 6 is a plan view of the carrier strip and formed leads with the active elements of transistors mounted on each group of leads, FIG. 7 is a plan view showing contact wires connected between the leads and the electrodes of the active elements of each transistor, FIG. 8 is a plan view showing the end portions of the leads, the active elements, and the contact wires of each transistor encapsulated in a mass of plastic, FIG. 9 is a perspective view showing the internal construction of a completed transistor after removal from the carrier strip with the outline of the plastic encapsulating material indicated in phantom, FIG. 10 is a plan view of a plurality of semiconductor elements comprising the active elements of transistors pre-mounted on a strip of supporting headers in accordance with a modification of the method of the invention, FIG. 11 is a plan view illustrating the semiconductor elements of FIG. 10 separated into individual units and mounted on leads fixed in a carrier strip, FIG. 12 is a plan view showing the end portions of the leads and semiconductor elements encapsulated in separate masses of encapsulating material, and FIG. 13 is a perspective view showing the internal construction of a completed transistor after removal from the carrier strip with the outline of the encapsulating material indicated in phantom.

A fragment of a disposable carrier strip 10 employed in practicing the method of the invention is illustrated in FIG. 1 and also in FIGS. 2 and 3. The carrier strip is fabricated of thin metal sheet. The strip includes a continuous substantially planar central region 11 extending along its length. At one edge of the central region are a plurality of lead receiving members 12 spaced at equal intervals along the length of the strip. Each lead receiving member extends generally perpendicular to the central region of the strip and has three apertures 13 which are equally spaced and arranged in a straight line substantially parallel to the plane of the central region 11. The apertures are slightly larger in diameter than the diameter of leads which are to be inserted in the carrier. The lead receiving members 12 are indented immediately adjacent each aperture to provide a flared opening which facilitates the insertion of leads in the apertures.

Along the opposite edge of the central region of the carrier strip are a plurality of bonding surface regions 14, each one directly opposite a corresponding lead receiving member 12. Each bonding surface lies generally parallel to the plane of the central region at a height above the central region generally the same as that of the lowermost edge of each locating aperture. Each surface region is held in position above the central region by a supporting member 15 which is normal to the central region and to the surface region. As illustrated in FIG. 3 the arrangement of locating apertures and bonding surface regions causes a lead 20 which is inserted in an aperture and is in contact with the bonding surface to lie generally parallel to the plane of the central region.

Each lead receiving member 12, its corresponding bonding surface region 14, and the portion of the central region lying between constitutes a lead supporting section or a device position of the carrier strip adapted to hold a group of conductive leads for a device. A hole 16 is located in each intervening portion of the central region between two lead supporting sections. The holes provide indexing means by which the strip can be engaged for moving and accurately positioning the strip during processing according to the invention. In addition, the holes facilitate flexing of the carrier strip transverse to the length of the strip at each of these portions. Thus, the strip, which may contain up to several hundred lead supporting sections, may be wound on a reel or otherwise handled by means which require flexing. The upstanding lead receiving members 12 and supporting members 15 prevent flexing at the lead supporting sections.

The carrier strip may be fabricated, for example, of 5 mil thick stainless steel and be adapted to hold a group of three leads $1\frac{1}{16}$ inch long of 18 mils diameter at each lead supporting section. The locating apertures are approximately 0.3 to 0.5 mil greater in diameter than the diameter of the leads. The distance between the centers of the apertures in each lead receiving member is approximately 50 mils. The lead receiving members 12 and bonding surface regions 14 are centered approximately every 0.3 inch along the strip.

As illustrated in FIGS. 2 and 3 straight conductive leads 20, which, for example, may be of gold-plated Kovar are placed in the carrier strip and fixed to it. Each lead is inserted in a locating aperture 13 with one end portion 21 extending beyond the edge of the strip. The opposite end portion 22 rests on a corresponding bonding surface region 14 and is bonded to it as by welding adjacent the edge at 23. The leads of each group are thereby held in fixed relationship with respect to each other. As shown in FIG. 2, the leads are substantially parallel to each other and are transverse to the length of the strip. As can be seen from FIGS. 2 and 3 with the leads 20 bonded to the bonding surface region 14 and closely held within the aperture 13, each device position of the strip together with its associated leads forms a box-like structure which resists bending or twisting.

The leads 20 may be supplied in the form of individual leads pre-cut to length, or may be supplied in the form of wire fed continually from reels and severed from the reels after insertion and bonding to the carrier strip. As can be seen from FIG. 2, the leads in the strip are arranged in a plurality of groups of three leads, each group being held in fixed position at a lead supporting section by a lead receiving member 12 and the weld to the corresponding bonding surface region 14.

The end portions 21 of the leads which extend beyond the lead receiving members 12 are then formed, as illustrated in FIG. 4, as by swaging, to prepare them for receiving the electrically active elements of a semiconductor device and the electrical connections between the active elements and the leads. The inner or central lead of each group of three leads is flattened at its end. The two outer leads of each group are formed so as to provide flat areas and outwardly extending projections **21*a***.

FIG. 5 illustrates the electrically active elements 30 of a transistor, one of which is to be mounted on each group of formed leads. For purposes of illustration the electrically active elements 30 constitute a double-diffused transistor. This type of device is produced by the diffusion of a suitable conductivity type imparting material into a zone of a die 31 of semiconductor material to form a rectifying junction. Another conductivity type imparting material is then diffused into a portion of this zone to form another rectifying junction. Separate metallized contacts are provided to the portion of the zone and to the remainder of the zone at the upper surface of the die, and to the remainder of the die at the lower surface of the die. These active regions of the semiconductor die and their metal contacts serve as the emitter 32, base 33, and collector 34 electrodes, respectively, of the device.

The electrically active elements 30 of the transistor may, for example, be fabricated of a die of silicon approximately 15 mils square and 6 mils thick having opposed flat parallel, major surfaces. The major portion of the die constituting the collector region is of N-type conductivity. A P-type base region and an N-type emitter region are formed in the die by two successive diffusions of conductivity type imparting materials at the upper surface. A gold plating 34 on the bottom surface of the die provides a contact for the collector region, and aluminum vacuum deposited on the upper surface provides contacts 32 and 33 to the emitter and base regions, respectively.

As shown in FIG. 6 the active elements of a semiconductor device 30 is mounted on the inner or center lead 20 of each group of leads held in the carrier strip. The die is placed on the flattened portion of the lead with the collector contact 34 in contact with the lead. Then the die and the end of the lead are heated to fuse the plated contact to the lead and provide good electrical and mechanical contact between the die and lead.

Next, electrical connections are made from the emitter and base electrodes 32 and 33 to the outer leads of each associated group of leads. A first contact wire 35 is bonded to the emitter electrode 32 and to the flattened portion of an associated outer lead 20. The contact wire, which may be 0.7 mil diameter aluminum wire, is attached as by following well-known techniques of thermal compression bonding. A second contact wire 36 is bonded to the base electrode 33 and to the flattened end portion of the other outer lead of the associated group of leads.

The end portions 21 of the leads of each group of leads together with the associated active elements 30 and contact wires 35 and 36 are encapsulated in a mass of non-conductive encapsulating material 38 as illustrated in FIG. 8. The parts of the device may be encapsulated by immersing in a quantity of a suitable potting plastic which solidifies to form a rigid mass. Alternatively, the parts may be encapsulated by injection molding using a suitable resin of the epoxy type, for example Hysol (trade name) MH6F epoxy resin sold by Houghton Laboratories.

Since each rigid mass of plastic 38 now supports its associated group of leads 20 and the other parts embedded in the mass, the carrier strip 10 is no longer needed. The individual completed semiconductor devices are separated from the carrier strip by cutting each surface bonding region 14 and the welded end portions 22 of the leads from the remainder of the carrier strip and the remaining portion of each lead. The carrier strip and the leads are severed along the line indicated by the dashed line 39 in FIG. 8. Sections of the leads projecting from each mass of plastic are thus released from the carrier strip, and each device may be removed from the strip.

A completed device removed from the carrier strip is illustrated in FIG. 9, the encapsulating plastic mass 38 being shown in phantom. The three leads 20 are held fixed in the rigid mass of plastic 38 so that their relative positions remain unchanged. The flattened end portion 21 of the center lead and the projections 21*a* of the two outer leads lock the leads in place. The electrically active elements 30 are mounted on the center lead 20 with the collector electrode 34 making electrical contact to that lead. The emitter electrode 32 is electrically connected to a first outer lead by the first contact wire 35, and the base electrode 33 is electrically connected to the second outer lead by the second contact wire 36. The plastic mass not only supports the leads in position, but also serves to protect the embedded active elements and contact wires.

As can be seen, the parts employed in fabricating each device are few in number and of extremely simple configuration. In addition to the electrically active elements, the device uses three straight conductive leads, two contact wires, and a quantity of encapsulating material. The active elements are produced by well known batch processing techniques. The leads are readily produced and easily handled in bulk, or may be supplied directly to the carrier strip as reeled wire. The leads are not preformed. The lengths of fine contact wire are supplied to their point of utilization as reeled wire. All of the insulating supporting and protective structure of the device is obtained from a quantity of encapsulating material which is prepared in bulk. The parts and materials employed in the fabrication of a semiconductor device according to the invention are thus simple in form and require a minimum of specialized preparation and handling.

After the parts are assembled in the carrier strip and become associated as items of individual devices, they are held in known orientation and spaced relationship with respect to other parts of the same device, the carrier strip, and parts of other devices. Thus, the parts may still be handled in bulk and readily manipulated for processing steps which are performed successively at each device position of the carrier strip.

The carrier strip itself is completely discarded and no portion of it constitutes any part of a completed device. Therefore, no expensive processing of the carrier strip or of portions of the strip is required in order to prepare a specialized element to be included in the device. The carrier strip may be fabricated as by stamping from a strip of sheet metal. No additional preparation is required.

A modification of the method of the invention is illustrated in FIGS. 10 through 13. FIG. 10 illustrates a plurality of semiconductor elements 40 arranged in a strip. The strip includes a flat insulating board 41 on one surface of which a plurality of groups of conductive region 42 have been placed. The three principal conductive regions 42 of each group have portions which lie generally parallel to each other and are spaced apart in substantially the same relationship as the three locating apertures 13 in a lead receiving member 12 of the carrier strip 10. Each group of conductive regions and the adjacent portion of the insulating board serves as a support or header for the electrically active elements 45 of a semiconductor device.

The electrically active elements 45 include a die of semiconductor material 46 having three active regions therein and three conductive supporting members 47 which contact the active regions and project from the die. Each of the three supporting members 47 is bonded to one of the three principal conductive regions 42 of the header. A fourth supporting member 48 which is not electrically connected to an active region of the die is bonded to a fourth conductive region for additional physical support. The strip of semiconductor elements as shown may be produced according to the method disclosed and claimed in application Ser. No. 539,444, filed Apr. 1, 1966, by Brian Dale and Robert C. Ingraham entitled "Method of Producing Semiconductor Devices" and assigned to the assignee of the present invention.

The strip of semiconductor elements 40 as shown in FIG. 10 is divided into a plurality of individual semiconductor elements by cutting the insulating board 41 along the dashed lines 49. Each semiconductor element 40 comprising a header and mounted active elements is attached to a group of leads 20 supported at a device position in the carrier strip 10 as illustrated in FIG. 11. The carrier strip and leads are previously assembled as shown in FIG. 2. The end portions 21 of the leads of each group are bonded to mating portions of corresponding conductive regions 42 of the header by welding. The insulating board 41 may be cut to form separate semiconductor elements prior to the welding operation, or they may be separated as a step in the welding process.

As illustrated in FIG. 12 each semiconductor element 45 and the adjacent end portions 21 of its associated leads are encapsulated in a mass of encapsulating material 50 similar to the manner in which the devices of FIG. 7 are encapsulated as shown in FIG. 8. Then, the bonding surface regions 14 and the opposite end portions 22 of the leads which are bonded to it are severed by cutting along the dashed line 51 indicated in FIG. 12. The completed semiconductor devices may then be withdrawn from the locating apertures of the carrier strip.

A completed transistor produced according to this modification of the invention is illustrated in FIG. 13, the encapsulating plastic mass 50 being shown in phantom. The device includes a mounting header 41*a* from the strip of headers having separate conductive regions 42 electrically insulated from each other. Portions of the conductive regions are connected electrically and mechanically to conductive supporting members 47 of the electrically active elements 45 of a transistor. The supporting members 47 are also in electrical contact with the active regions of the semiconductor die. The header 41*a*, electrically active elements 45, and adjacent end portions 21 of the leads 20 are embedded in the one piece protective plastic enclosure 50.

While there has been shown and described what are considered preferred embodiments of the present invention, it will be obvious to those skilled in the art that various changes and modifications may be made therein without departing from the invention as defined in the appended claims.

What is claimed is:

1. The method of producing semiconductor devices including the steps of placing a plurality of groups of three straight conductive leads in predetermined spaced apart relationship to each carrier strip with the leads generally parallel to each other and with one end portion of each lead extending beyond the edge of the carrier strip, and bonding the opposite end portion of each of the leads to the carrier strip, mounting a separate semiconductor element in fixed position on said one end portions of the leads of each group of leads with the leads of each group electrically connected to active regions of the associated semiconductor element, encapsulating each of the mounted semiconductor elements and the one end portions of the leads of the associated group of leads in a separate mass of rigid non-conductive encapsulating material, and severing a portion of the carrier strip and the opposite end portions of the leads bonded thereto from the remainder of the carrier strip and from the remaining portion of each of the plurality of leads to permit removal of each mass of encapsulating material, the associated mounted semiconductor element, and the remaining portion of each of the leads of the associated group of leads from the remainder of the carrier strip.

2. The method of producing semiconductor devices according to claim 1 wherein each of said semiconductor elements comprises the active elements of a semiconductor device having one surface including a first electrode of the device and an opposite surface including second and third electrodes of the device; and wherein mounting a separate semiconductor element in fixed position on said one end portions of the leads of each group of leads includes bonding the active elements of a separate semiconductor device to the one end portion of a first lead of each group of leads with the first electrode in electrical contact with the first lead, bonding a separate first contact wire to the second electrode of each device and to the one end portion of a second lead of the associated group of leads, and bonding a separate second contact wire to the third electrode of each device and to the one end portion of a third lead of the associated group of leads.

3. The method of producing semiconductor deivces according to claim 1 wherein each of said semiconductor elements includes the active elements of a semiconductor device and a header on which the active elements are mounted, said header having three separate conductive regions electrically connected to the active elements and adapted to mate with corresponding one end portions of the leads of a group of leads; and wherein mounting a separate semiconductor element in fixed position on said one end portions of the leads of each group of leads includes bonding the three conductive regions of the header of each semiconductor element to the corresponding one end portions of the leads of a group of leads.

4. The method of producing semiconductor devices including the steps of providing an elongated carrier strip having adjacent one edge a plurality of groups of three locating apertures adapted to removably receive conductive leads arranged generally parallel to each other and having adjacent the opposite edge a bonding surface adapted to have conductive leads bonded thereto, placing a plurality of conductive leads in said carrier strip with a lead in each of said locating apertures and with one end portion of each lead extending a predetermined distance beyond said one edge of the carrier strip, and bonding the opposite end portion of each lead to said bonding surface, mounting a separate semiconductor element in fixed position on said one end portions of the leads of each group of leads with the leads of each group electrically connected to active regions of the associated semiconductor element, encapsulating each of the mounted semiconductor elements and the one end portions of the leads of the associated group of leads in a separate mass of rigid nonconductive encapsulating material, severing said bonding surface and the opposite end portions of the leads bonded thereto from the remainder of the carrier strip and the remaining portion of each of the plurality of leads, and removing each of the plurality of encapsulated semiconductor elements and the remaining portions of each of the leads of the associated group of leads from the remainder of the carrier strip.

5. The method of producing semiconductor devices according to claim 4 wherein each of said semiconductor elements comprises the active elements of a transistor including a die of semiconductor material having two flat, parallel, opposed major surfaces, one of said major surfaces of the die including a collector electrode of the transistor and the other of said major surfaces including an emitter electrode and a base electrode; and wherein mounting a separate semiconductor element in fixed position on said one end portions of the leads of each group of leads includes bonding a separate die of semiconductor material on said one end portion of a first lead of each group of leads with the collector electrode in electrical contact with the first lead, bonding a separate first contact wire to each emitter electrode and to the one end portion of a second lead of the associated group of leads, and bonding a separate second contact wire to each base electrode and to the one end portion of a third lead of the associated group of leads.

6. The method of producing semiconductor devices according to claim 4 wherein each of said semiconductor elements includes a die of semiconductor material having the active regions of a transistor formed therein and a header on which the die is mounted, said header having three separate conductive regions each electrically connected to an active region of the die and each having a portion arranged generally parallel to each other in spaced apart relationship substantially equal to the spaced apart relationship of the three locating apertures of each group of locating apertures in the carrier strip; and wherein mounting a separate semiconductor element in fixed position on said one end portions of the leads of each group of leads includes bonding said portions of the three conductive regions of the header of each semiconductor element to the corresponding one end portions of the leads of a group of leads.

7. The method of producing semiconductor devices including the steps of providing an elongated carrier strip having a thin substantially planar central region, a plurality of lead receiving portions arranged in spaced apart relationship along one edge of the strip, said lead receiving portions extending generally perpendicular to the central region and each having a group of three locating apertures arranged in spaced apart relationship along a line parallel to said central region and adapted to removably receive conductive leads, a plurality of bonding regions arranged in spaced apart relationship along the opposite edge of the strip, each bonding region being opposite the central region from a corresponding lead receiving portion and extending parallel to the central region in a plane spaced from the central region substantially the distance between the central region and the locating apertures, placing a plurality of straight conductive leads of substantially equal length in the carrier strip with a lead inserted through each of said locating apertures and with one end portion of each lead extending a predetermined distance beyond the associated lead receiving portion, and bonding the opposite end portion of each lead to the corresponding bonding region opposite the associated lead receiving portion, mounting a separate semiconductor element in fixed position on said one end portions of the lead of each group of leads with the leads of each group electrically connected to active regions of the associated semiconductor element, encapsulating each of the mounted semiconductor elements and the one end portions of the leads of the associated group of leads in a separate mass of rigid non-conductive encapsulating material, severing said bonding regions and the opposite end portions of the leads bonded thereto from the remainder of the carrier strip and the remaining portion of each of the plurality of leads, and removing each of the plurality of encapsulated semiconductor elements and the remaining portions of each of the leads of the associated group of leads from the remainder of the carrier strip.

8. The method of producing semiconductor devices according to claim 7 wherein each of said semiconductor elements comprises the active elements of a transistor including a die of semiconductor material having two flat, parallel, opposed major surfaces, one of said major surfaces of the die including a collector electrode of the transistor and the other of said major surfaces including an emitter electrode and a base electrode; and wherein mounting a separate semiconductor element in fixed position on said one end portions of the leads of each group of leads includes bonding a separate die of semiconductor material on said one end portion of a first lead of each group of leads with the collector electrode in electrical contact with the first lead, bonding a separate first contact wire to each emitter electrode and to the one end portion of a second lead of the associated group of leads, and bonding a separate second contact wire to each base electrode and to the one end portion of a third lead of the associated group of leads.

9. The method of producing semiconductor devices according to claim 7 wherein each of said semiconductor elements includes a die of semiconductor material having the active regions of a transistor formed therein and a header on which the die is mounted, said header having three separate conductive regions lying substantially in a plane each electrically connected to an active region of the die and each having a portion arranged generally parallel to each other in spaced apart relationship substantially equal to the spaced apart relationship of the three locating apertures of each group of locating apertures in the carrier strip; and wherein mounting a separate semiconductor element in fixed position on said one end portions of the leads of each group of leads includes bonding said portions of the three conductive regions of the header of each semiconductor element to the corresponding one end portions of the leads of a group of leads.

References Cited

UNITED STATES PATENTS

| | | | |
|---|---|---|---|
| 3,073,007 | 1/1963 | Rubinstein et al. | 29—25 |
| 3,121,279 | 2/1964 | Van Hoof et al. | 29—627 |
| 3,281,628 | 10/1966 | Bauer et al. | 29—588 X |
| 3,341,649 | 9/1967 | James | 29—588 X |

PAUL M. COHEN, Primary Examiner

U.S. Cl. X.R.

29—589, 624, 627; 317—235

PO-1050
(5/69)

UNITED STATES PATENT OFFICE
CERTIFICATE OF CORRECTION

Patent No. 3,464,105 Dated September 2, 1969

Inventor(s) Paul L. Chagnon

It is certified that error appears in the above-identified patent and that said Letters Patent are hereby corrected as shown below:

Column 7, line 6, "to each" should be--in a--

SIGNED AND
SEALED
JUL 14 1970

(SEAL)
Attest:

Edward M. Fletcher, Jr.
Attesting Officer

WILLIAM E. SCHUYLER, JR.
Commissioner of Patents